United States Patent
Chang et al.

(10) Patent No.: US 10,162,751 B2
(45) Date of Patent: Dec. 25, 2018

(54) NESTED WRAP-AROUND MEMORY ACCESS WITH FIXED OFFSET

(71) Applicant: MACRONIX INTERNATIONAL CO., LTD., Hsinchu (TW)

(72) Inventors: Kuen-Long Chang, Taipei (TW); Ken-Hui Chen, Hsinchu (TW); Chin-Hung Chang, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 143 days.

(21) Appl. No.: 15/139,252

(22) Filed: Apr. 26, 2016

(65) Prior Publication Data

US 2017/0308463 A1   Oct. 26, 2017

(51) Int. Cl.
*G06F 12/06* (2006.01)

(52) U.S. Cl.
CPC .. *G06F 12/0623* (2013.01); *G06F 2212/1044* (2013.01); *G06F 2212/2022* (2013.01)

(58) Field of Classification Search
None
See application file for complete search history.

(56) References Cited

U.S. PATENT DOCUMENTS

| | | | | |
|---|---|---|---|---|
| 6,092,153 A * | 7/2000 | Lass | ................ | G06F 12/0862 711/133 |
| 6,560,691 B2 * | 5/2003 | Chen | ................ | G06F 7/72 711/109 |
| 2001/0049174 A1 * | 12/2001 | Pitts | ................ | G11C 29/028 438/381 |
| 2003/0033499 A1 * | 2/2003 | Chou | ................ | G06F 5/10 711/220 |
| 2006/0112235 A1 * | 5/2006 | Cabot | ................ | G06F 12/0879 711/141 |
| 2008/0244132 A1 * | 10/2008 | Li | ................ | G06F 13/28 710/110 |
| 2017/0185353 A1 * | 6/2017 | Intrater | ................ | G06F 3/0659 |

OTHER PUBLICATIONS

GD25Q41B Datasheet, rev. 1.0—Uniform Sector Dual and Quad Serial Flash, Jul. 16, 2014, ELM Electronics, 48 pages.
SST Serial Quad I/O (SQI) Flash Memory, SST26VF016 / SST26VF032, Data Sheet, Jun. 2010, 39 pages.

* cited by examiner

*Primary Examiner* — Ann J Lo
*Assistant Examiner* — Chie Yew
(74) *Attorney, Agent, or Firm* — Yiding Wu; Haynes Beffel & Wolfeld LLP

(57) ABSTRACT

A nested wrap-around technology includes an address counter and associated logic for generating addresses to perform a nested wrap-around access operation. The nested wrap-around access operation may be a read or a write operation. A wrap-around section length and a wrap-around count define a wrap-around block. A wrap starting address, initially set to a supplied start address, is offset from a lower boundary of a wrap-around section. Access starts at a wrap starting address and proceeds in a wrap-around manner within a wrap-around section. After access of the address immediately preceding the wrap starting address, the wrap starting address is incremented by the wrap-around section length, or, if the wrap-around section is the last one in the wrap-around block, the wrap starting address is set to the lower boundary of the wrap-around block plus the offset. Access continues until a termination event.

18 Claims, 5 Drawing Sheets

NESTED WRAP-AROUND MEMORY ACCESS WITH FIXED OFFSET

BACKGROUND

Field of the Technology

The present technology relates to a nested wrap-around access operation for memory.

Description of Related Art

Referring to FIG. 1, some memory devices, such as NOR flash memory, can be read using a wrap-around feature, in which reading begins at a starting address within a wrap-around unit having a defined length, reads to the end, and wraps back to the beginning. The length of the wrap-around unit may be, for example, 8, 16, 32, or 64 bytes.

FIG. 1 depicts a wrap-around read with a wrap-around unit of 16 bytes, the read beginning at start address 241. The read continues to the end of the 16-byte unit, address 255, wraps back to the start of the unit, address 240, and continues. The lower boundary of the wrap-around unit can be the highest address at or before the start address that is evenly divisible by the length of the wrap-around unit.

This wrap-around read is useful, but is limited. Expanded wrap-around read options would provide more flexible access to memory.

SUMMARY

A device configured to execute an access operation is described, variations of which can be referred to as a nested wrap-around. A device as described herein can including logic responsive to a command specifying a supplied starting address to generate an address sequence for a block of addressable memory including a number N of sections (wrap-around count), each section including a number M of addressable units (section length). The address sequence can include N address sub-sequences, including a starting sub-sequence for a starting section identified by the supplied starting address, and arranged in a series of sub-sequences incrementing by section to an upper boundary of the block, wrapping around to a lower boundary of the block, and incrementing from the lower boundary. In a nested fashion, each sub-sequence of a given section having up to M addresses, including a starting address at an address offset identified by the supplied starting address, and arranged in a series of addresses incrementing by an addressable unit until an upper boundary of the given section, wrapping around to a lower boundary of the given section, and incrementing from the lower boundary in a wrap-around fashion. In a nested wrap around operation, the address offset is non-zero. The disclosed technology also is operable if a zero offset sequences is desired.

An example of the device comprises a memory, a parameter store holding a first parameter specifying a wrap-around section length, and a second parameter specifying a wrap-around count, where the wrap-around count, or the wrap-around section length and the wrap-around count, define a wrap-around block having a lower boundary and an upper boundary. The device comprises logic responsive to a command specifying a supplied starting address for the nested wrap-around access operation, where the supplied starting address has an offset from a lower boundary of a wrap-around address section, to generate an address sequence for the access operation until a termination event. The address sequence includes, after setting a wrap starting address to the supplied starting address: a) a section wrap-around portion beginning with the wrap starting address, incrementing by an addressable unit until an upper boundary of the wrap-around address section, wrapping around to the lower boundary of the wrap-around address section, and incrementing until an address of an addressable unit immediately precedes the wrap starting address, b) if the wrap-around count is greater than one, and the wrap starting address plus the wrap-around section length is less than the upper boundary of the wrap-around block, then incrementing the wrap starting address by the wrap-around section length, else setting the wrap starting address to the lower boundary of the wrap-around block plus the offset, and c) repeating steps a) and b). In some examples, the wrap-around access operation is a read operation, while in other examples it is a write operation. The access operation for a block of memory including sections can be executed in response to a single external command received by a memory device, using address sequencing logic on the chip supplying the starting address, with the parameters of the nested wrap around carried as part of the command (immediate data) or read from a parameter store on or accessible by the device.

In embodiments described herein, the termination event is receipt of a control signal. In embodiments, the lower boundary and upper boundary of the wrap-around address section have addresses in which members of a first set of least significant bits are all zero or are all one, respectively. In some examples, the lower boundary and upper boundary of the wrap-around block have addresses in which members of a second set of least significant bits are all zero or are all one, respectively. The wrap-around block may be an entire addressable space of the memory.

In some examples, the parameter store in which the wrap-around section length and wrap-around count are stored is non-volatile memory. The parameter store may be a write-once memory. The wrap-around section length or the wrap-around count may be set as a command parameter.

A nested wrap-around access operation configured to be executed by a device is described herein. The nested wrap-around access operation comprises receiving a command specifying a supplied starting address for the nested wrap-around access operation, where the supplied starting address has an offset from a lower boundary of a wrap-around address section. The nested wrap-around access operation further comprises generating an address sequence until a termination event, using a first parameter specifying a wrap-around section length, and a second parameter specifying a wrap-around count, the first parameter and the second parameter held in a parameter store, where the wrap-around count, or the wrap-around section length and the wrap-around count, define a wrap-around block having a lower boundary and an upper boundary. The address sequence includes, after setting a wrap starting address to the supplied starting address a) a section wrap-around portion beginning with the wrap starting address, incrementing by an addressable unit until an upper boundary of the wrap-around address section, wrapping around to the lower boundary of the wrap-around address section, and incrementing until an address of an addressable unit immediately precedes the wrap starting address, b) if the wrap-around count is greater than one, and the wrap starting address plus the wrap-around section length is less than the upper boundary of the wrap-around block, then incrementing the wrap starting address by the wrap-around section length, else setting the wrap starting address to the lower boundary of the wrap-around block plus the offset, and c) repeating steps a) and b).

A method for nested wrap-around addressing is described herein. The method comprises using a starting address, a wrap-around section length and a wrap-around block length, a) in a current wrap-around section identified by the starting address, generating a set of addresses addressing the current wrap-around section in a wrap-around manner starting at an offset address within the current wrap-around section identified by the starting address, the current wrap-around section being in a wrap-around block having the wrap-around block length, b) proceeding in a wrap-around manner to a next section in the wrap-around block, and c) repeating steps a) and b), until a termination event.

The method may include storing a wrap-around section length parameter and a wrap-around count parameter, wherein the wrap-around section length is determined using the wrap-around section length parameter and the wrap-around block length is determined using the wrap-around section length parameter and the wrap-around count parameter.

Various other embodiments are apparent to those of ordinary skill in the art from the present document.

DETAILED DESCRIPTION

Figure 1:
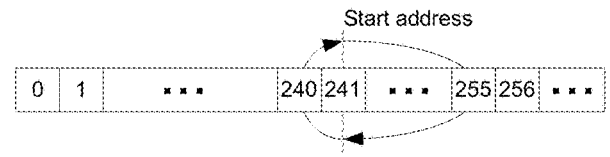
FIG. 1 shows a prior art wrap-around read.

A wrap-around operation is described herein that can be characterized as nested, with an inner wrap-around and an outer wrap-around. The length of the inner wrap-around is defined by a first parameter, wrap-around section length. A second parameter, the wrap-around count, describes the number of wrap-around sections in the larger wrap-around block of the outer wrap-around. Wrap-around section length and wrap-around count combine to provide increased flexibility. This flexibility is useful in a synchronous serial interface, in which input and output data rates may be limited. The parameters can be stored in parameter store implemented using volatile or non-volatile memory.

The wrap-around access operation can be a read or a write operation. In flash memory, a write operation can include program and erase operations. The wrap-around access can apply to both program and erase, although often the erase operation is based on erase blocks that may not be suitable for wrap-around access operations. For simplicity, most examples in this discussion will describe a nested wrap-around read operation, but it will be understood that, so long as data is provided to be written to the addresses generated by the nested wrap-around access operation, the techniques described could apply to a nested wrap-around write operation.

In embodiments of the technology described herein, a wrap-around access operation, such as a wrap-around read command, is supplied with a start address. A wrap-around section length and a wrap-around count are stored in a parameter store. Multiplying wrap-around section length by wrap-around count yields the size of the wrap-around block in addressable units. Addressable units may be bytes (8-bits), words (two or more bytes), nibbles (less than a byte such as 4 bits), etc.; for simplicity the examples given will assume the addressable units are bytes, but it will be understood that other units are possible. Responsive to a nested wrap-around access command, the wrap-around access operation described herein can be configured to continuously read or program within the wrap-around block in a manner defined by the wrap-around section length and wrap-around count, until a termination event, such as a control signal, is detected.

First a manner in which the nested wrap-around access operation can generate addresses will be described. A following section will describe an address counter and associated elements which may be used in some embodiments to implement the address generation sequence.

Address Sequence Generation

A method for nested wrap-around addressing is described that uses a starting address, a wrap-around section length and a wrap-around block length. The process includes step a) in a current wrap-around section identified by the starting address, generating a set of addresses addressing the current wrap-around section in a wrap-around manner starting at an offset address within the current wrap-around section identified by the starting address. Then, the process in step b), proceeds in a wrap-around manner to a next section, and in step c) the process repeats step a) for the next section, until a termination event. This results in a nested wrap-around address sequence, including inner wrap-around sequences over addressable units within sections, and output wrap-around sequences over addressable sections within a block.

The method can include storing a wrap-around section length parameter and a wrap-around count parameter, wherein the wrap-around section length is determined using the wrap-around section length parameter, and the wrap-around block length is determined using the wrap-around section length parameter and the wrap-around count parameter.

Figure 2A:
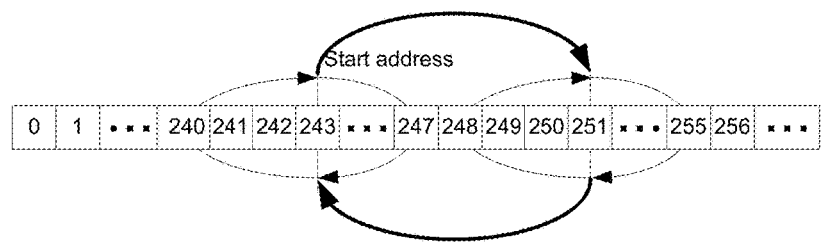
FIG. 2*a* shows a nested wrap-around access operation according to an embodiment of the technology described herein with wrap-around section length of 8 and wrap-around count of 2.

In the example of FIG. 2*a*, the wrap-around section length is 8 bytes and the wrap-around count is 2, for a wrap-around block of 8×2=16. The supplied start address is 243.

The nested wrap-around access operation is an inner wrap-around nested within an outer wrap-around. The inner wrap-around will wrap on addressable units (bytes, in this example) within a wrap-around section, then the outer wrap-around will wrap on wrap-around sections within the wrap-around block. The 16-byte wrap-around block of FIG. 2*a* includes two 8-byte wrap-around sections. The wrap-around sections start, respectively, at addresses 240 and 248 (decimal). In general, lower wrap-around section boundaries are addresses in which members of a set of least significant bits are all zero (binary). (The term least significant bits of the address, as the term is used herein, are the least significant bits that identify an addressable unit of the wrap-around access operation, the addressable unit in this case being an 8-bit byte. Single-bit addressing would require additional address bits that are not part of addressing an addressable unit of the wrap-around operation.) In this example, the least significant three bits of lower wrap-around section boundaries 240 and 248 are zeroes. Upper wrap-around section boundaries (here 247 and 255) are addresses in which members of a set of least significant bits are all ones. In this example, the three least significant bits of upper wrap-around section boundaries 247 and 255 are all ones. Three bits is the number of bits necessary to express 8 states; 8 is the wrap-around section length.

In this example the supplied starting address is 243, the fourth byte in the wrap-around section starting at address 240. Wrapping begins at a wrap starting address, so the wrap starting address is first set to 243, the supplied starting address. The address is incremented by an addressable unit (here one byte) and reading proceeds to the upper boundary of the wrap-around section, 247, then wraps to the lower boundary of the wrap-around section, 240. Reading continues until the address is 242, immediately preceding the wrap starting address 243. This will be described as reading in a wrap-around manner. After reading in a wrap-around manner, the wrap starting address is then incremented by the wrap-around section length, 243+8=251. From 251, reading proceeds in a wrap-around manner in the next wrap-around section, to the upper boundary at 255, back to the lower boundary at 248, and to the address 250, which immediately precedes wrap starting address 251, completing the second wrap-around section. The read then jumps back to address 243 in the first wrap-around section, and continues in a wrap-around manner. The nested wrap-around access operation can continue generating addresses, and memory is read or written at the generated addresses, until a termination event.

Figure 2B:
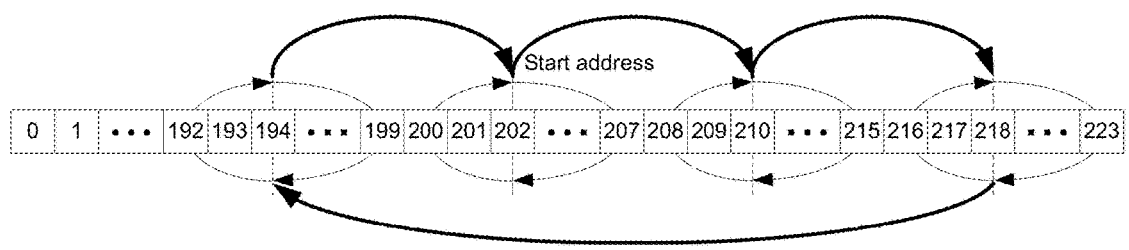
FIG. 2*b* shows a wrap-around access operation according to an embodiment of the technology described herein with wrap-around section length of 8 and wrap-around count of 4.

In the example of FIG. 2b, the wrap-around section length is 8 and the wrap-around count is 4, for a wrap-around block of 4×8=32. The supplied start address is 202. The lower and upper boundaries, respectively, of the wrap-around block are 192 and 223, and there are four wrap-around sections in the wrap-around block, with lower boundaries of 192, 200, 208, and 216. Note that the lower boundary of the wrap-around block is the highest address at or below the starting address which is evenly divisible by the size of the wrap-around block, in this example. The length of the wrap-around block is 32, so the lower boundary of the wrap-around block is 192. When the length of the wrap-around block is 32, for any starting address between 192 and 223, the lower boundary of the wrap-around block is 192 and the upper boundary is 223. Put another way, the lower boundary of the wrap-around block has addresses in which members of a set of least significant bits are all zero (binary). The lower boundary of the wrap-around block is the highest address below the supplied starting address in which the B least significant bits are all zero (binary), where B is the number of bits required to express WL states, where WL is the length of the wrap-around block. The upper boundary of the wrap-around block has addresses in which members of a set of least significant bits are all ones (binary).

In the present example, the supplied start address, 202, is the third byte in the wrap-around section which has a lower boundary of 200. Its offset from lower boundary 200 is 2.

The lower boundary of a wrap-around section is the highest address at or below the wrap starting address which is evenly divisible by the length of the wrap-around section. Put another way, the lower boundary of the wrap-around section is the highest address below the wrap starting address in which the B least significant bits are all zero (binary), where B is the number of bits required to express L states, where L is the length of the wrap-around section.

The wrap starting address is set to the supplied starting address 202. Reading proceeds in a wrap-around manner, to 207, back to 200, and increments until 201, the address immediately preceding wrap starting address 202. The wrap starting address is then incremented by the wrap-around section length, 202+8=210. Reading again proceeds in a wrap-around manner, to 215, back to 208, until the next address is the incremented wrap starting address 210, then the wrap starting address is again incremented by the wrap-around section length, 210+8=218.

Reading proceeds in a wrap-around manner from 218, to 223, to 216, to 217, which immediately precedes wrap starting address 218. But incrementing wrap starting address 218 by the wrap-around section length would cause a jump from 218 to 226, which is past the upper boundary of the wrap-around block, 223. Access is restricted within the wrap-around block. Instead, the next address generated is the lower boundary of the wrap-around block, 192, plus the offset, 2; 192+2=194, so the next section wrap-around begins at a wrap starting address of 194. Reading continues in a wrap-around manner until 193, with addresses between the boundary and he wrap starting address, 194, and ending at the address 193 for full wrap around which immediately precedes the starting address 194 for the section. In some embodiments, it may be desirable to end the address subsequence or a given section at an address other than the address 193 immediately preceding the starting address. The wrap starting address is then incremented by the wrap-around section length, 194+8=202, which was the original supplied start address. Reading may continue in this manner until it is discontinued by a termination event, for example by receipt of a control signal.

The wrap-around count and wrap-around section length parameters may be stored in a parameter store implemented using non-volatile or volatile registers. For example, Table 1 lists wrap-around section lengths that may correspond to the possible values of a two-bit register:

TABLE 1

| Register[0:1] | Wrap-around section length |
| --- | --- |
| 00 | 8 addressable units |
| 01 | 16 addressable units |
| 10 | 32 addressable units |
| 11 | 64 addressable units |

Table 2 lists wrap-around counts that may correspond to the possible values of a two-bit register:

TABLE 2

| Register[0:1] | Wrap-around count |
| --- | --- |
| 00 | 1 |
| 01 | 2 |
| 10 | 4 |
| 11 | unlimited |

In other embodiments, the wrap-around count and wrap-around section length may be represented in more or fewer bits, and the values of wrap-around count and wrap-around section length may be interpreted differently; four values of wrap-around count may be interpreted as 2, 4, 8, and 16. For example, if three bits are provided for wrap-around section length, there will be eight possible values, which may be, for example, powers of two from 4 through 512. Other possibilities may be envisioned.

Wrap-around takes place within a wrap-around block, which can have a size in addressable units (such as a byte, a word, etc.) equal to the product of the wrap-around section length and the wrap-around count. In the example of FIG. 2a, a wrap-around section length of 8 bytes and a wrap-around count of 2 yielded a wrap-around block of 8 bytes× 2=16 bytes, from address 240 to address 255. In the example of FIG. 2b, a wrap-around section length of 8 bytes and a wrap-around count of 4 yielded a wrap-around block of 8 bytes×4=32 bytes, from address 192 to address 223. The length of the wrap-around block may be proportional to (e.g. equal to) the wrap-around section length times the wrap-around count. The wrap-around block in this example consists of a number of consecutive wrap-around sections, the number being the wrap-around count.

Figure 2C:
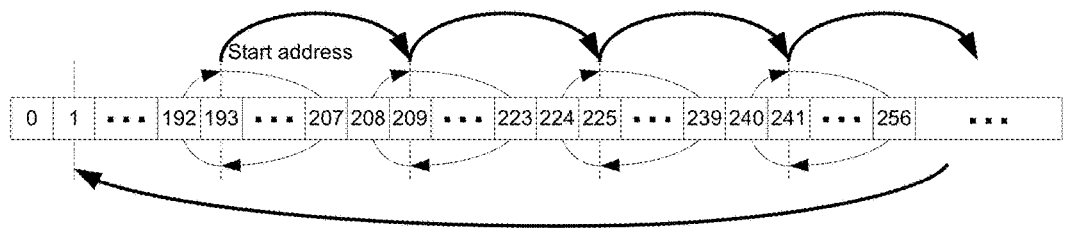
FIG. 2*c* shows a wrap-around access operation according to an embodiment of the technology described herein with wrap-around section length of 16 and unlimited wrap-around count.

In some embodiments, the wrap-around count is unlimited, and the length of the wrap-around block is the entire addressable space of the memory. Turning to FIG. 2c, in this example wrap-around section length is 16, start address is 193, and wrap-around count is unlimited. Reading starts in a wrap-around manner from start address 193. After wrapping, when the address is 192, immediately preceding the wrap starting address, the wrap starting address is incremented by the wrap-around section length, and wrap-around reading commences at address 209. The next jump is to 225, then 241, and so forth, jumping by the wrap-around section length until the end of the address space.

Following the final wrap-around read in the address space, the start address is set to the lower boundary of the wrap-around block, which is the beginning of the address space, plus the offset of the supplied start address from its lower wrap-around block boundary. For the example of FIG. 2c, the supplied start address is 193 and its lower wrap-around block boundary is 192, for an offset of 1. Thus, after jumping from the end of the address space, the lower wrap-around block boundary is 0 and the start address is set to 1.

More generally, in embodiments of the technology described herein, start address, wrap-around section length, and wrap-around count are supplied. Wrap-around section length and wrap-around count define a wrap-around block size. (Or, when wrap-around count is unlimited, the wrap-around block is the entire address space.)

From FIGS. 2a, 2b, and 2c, it can be seen that there are a plurality of wrap starting addresses within corresponding sections of the wrap-around block, spaced apart by the wrap-around section length (243 and 251 in FIG. 2a; 194, 202, 210, and 218 in FIG. 2b; and 1, 9, 17 . . . 193, 201, etc. in FIG. 2c.) One of the wrap starting addresses is coincident with the supplied start address. In response to a single wrap-around read command, reading commences in a wrap-around manner from the supplied start address for a number of read units (bytes, for example) defined by the wrap-around section length, then jumps to the next higher wrap starting address unless the current wrap starting address is the highest wrap starting address in the wrap-around block. In that case, reading jumps to the lowest wrap starting address in the wrap-around block. The wrap-around read continues successively to each wrap starting address in the wrap-around block.

Embodiments for Implementation

Figure 3:
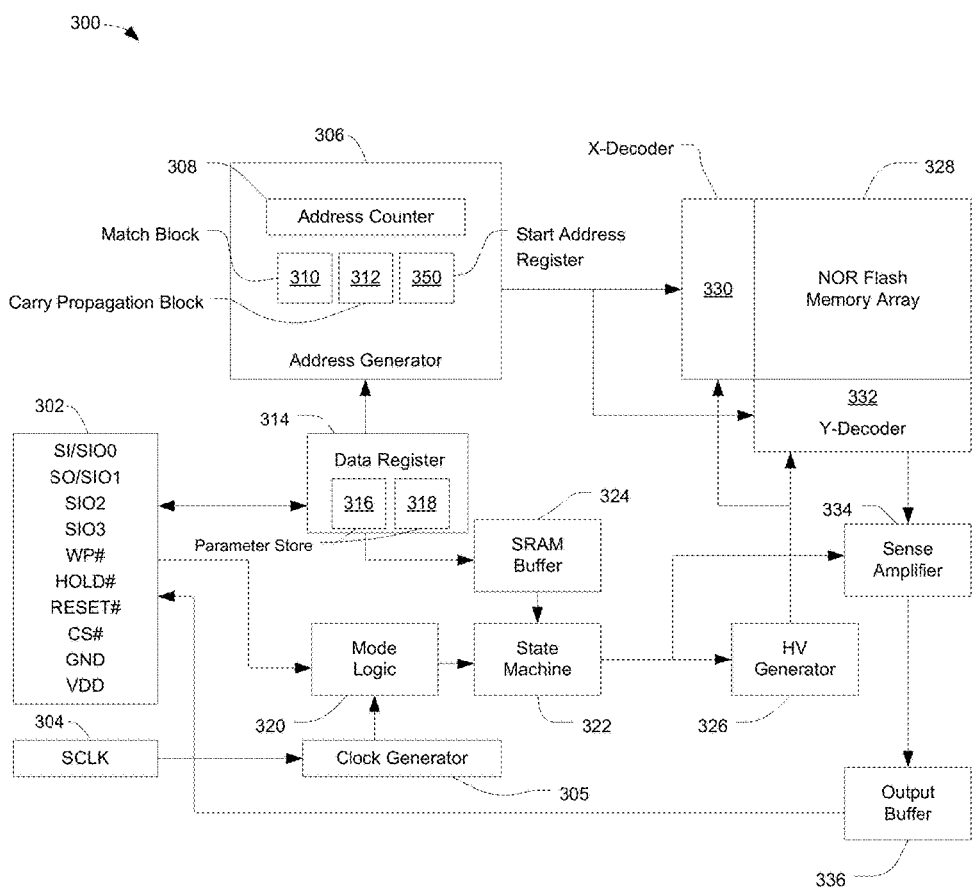
FIG. 3 is a simplified block diagram of a NOR flash memory device with a serial peripheral interface SPI, capable of performing a nested wrap-around access operation as described herein.

FIG. 3 is a simplified block diagram of an integrated circuit 300, for example an SPI NOR flash memory device, capable of performing a wrap-around read or write with wrap-around section length and wrap-around count as described herein. I/O block 302 shows a synchronous serial interface compliant with a serial peripheral interface SPI standard, and having standard pins. CS# is chip select. When CS# is brought low the device is selected. The HOLD# signal goes low to stop serial communication with the device, but doesn't stop the operation of write status register, programming, or erasing in progress. The RESET# signal allows the device to be reset, terminating the currently running process and resetting the state machine. The WP# signal provides write protection. GND and VDD are ground and power supply, respectively. In standard SPI, SI and SO are serial data input and output, respectively. In Dual SPI operation, SI and SO become bidirectional I/O pins: SIO0 and SIO1. In Quad SPI operation, SIO2 and SIO3 are available for higher-speed transfer. This is an example only; many pin configurations are possible. Serial clock SLCK 304 is also provided. A clock generator 305 on the integrated circuit generates clock signals for the mode logic 320 and other elements of the integrated circuit. In this embodiment the clock generator 305 receives the SCLK from the SLCK pin 304. Other types of serial interfaces and parallel interfaces can be used in various embodiments. Memory technologies other than NOR flash memory may be used.

A termination event to end the nested wrap-around access operation described herein may be receipt of a control signal. For example, in some embodiments CS# or RESET# may be toggled, such as being pulled low to high to end the nested wrap-around access operation. Alternatively or in addition, a termination event may be generated internally by the chip control logic. For example, the termination event can be a control signal generated when the wrap-around operation has completed a specified number of wraps around the wrap-around block, using a counter and a comparator.

Address generator 306 includes address counter 308, start address register 350, match control block 310, and carry propagation block 312. Data register 314 includes a parameter store, including registers 316 and 318. Device 300 also includes mode logic 320, which may generate internal control signals, and state machine 322. Data and parameters may be stored in SRAM buffer 324. High-voltage generator 326 generates any higher voltages required, for example for read, program, and erase operations. Memory array 328 includes X-decoder 330 and Y-decoder 332, and data signals are output to sense amplifier 334. Output buffer 336 may hold output data for output from the device. Those skilled in the art will appreciate that this diagram is provided for reference only; a device executing a nested wrap-around access operation as described herein may vary widely from this diagram, comprising different elements, connected in different ways.

Summarizing, the device of FIG. 3 may be configured to execute a nested wrap-around access operation. The device comprises a memory 328 and parameter store including registers 316 and 318, which may hold wrap-around section length and wrap-around count, respectively. A command specifies a supplied starting address, which may be stored in start address register 350. The supplied start address has an offset from a lower boundary of a wrap-around address section. Logic responsive to a command for the nested wrap-around access operation generates an address sequence for the access operation until a termination event, which may be a control signal received by way of I/O block 302. Such logic may reside in mode logic 320, state machine 322, and/or address generator 306, for example. The nested wrap-around operation comprises receiving a command specifying a supplied starting address, where the supplied starting address has an offset from a lower boundary of a wrap-around address section, and generating an address sequence until a termination event. In one example, a command can comprise a sequence of bytes received on the SIO pins in the I/O block. A sequence of bytes can include a first byte which acts as an operation code specifying a wrap-around read. A second byte, or a set of bytes following the first byte can consist of the starting address for the wrap-around read. After the command sequence, output data from the wrap-around read can be provided on the same SIO pins. The mode logic 320 can include logic to decode the operation code, route the start address to the address counter, and provide control signals to set up and initiate the read process in the state machine 322. A wrap-around write command can have a similar structure, wherein the write data is provided following the start address bytes of the command sequence. In parallel port devices, separate address bus lines and data bus lines can be used in parallel to provide command sequences. Command sequences can also be produced by on-chip logic, such as in system-on-a-chip devices, and provided to the memory using on-chip communication resources.

As has been described, the address sequence includes a) a section wrap-around portion beginning with the wrap starting address, incrementing by an addressable unit until an upper boundary of the wrap-around address section, wrapping around to the lower boundary of the wrap-around address section, and incrementing until an address of an addressable unit immediately precedes the wrap starting address, b) if the wrap-around count is greater than one, and the wrap starting address plus the wrap-around section length is less than the upper boundary of the wrap-around block, then incrementing the wrap starting address by the wrap-around section length, else setting the wrap starting address to the lower boundary of the wrap-around block plus the offset, and c) repeating steps a) and b).

For simplicity, the parameter store including registers 316 and 318 is shown in data register 314. Registers 316 and 318 will hold wrap-around section length and wrap-around count, respectively. The configuration in which registers 316 and 318 reside in data register 314 is just one embodiment, and these registers may exist elsewhere. As mentioned, these parameters can be stored in volatile or non-volatile memory, and may be provided to the nested wrap-around access operation in various ways. Either or both of these values can be factory-set; an example might be a write-once memory such as fuse memory which is set before the device is shipped. Either or both may be field settable. Either or both may be stored in a write-once memory such as fuse memory, or may be stored in read/write memory such as SRAM, flash memory or any other type of memory. Either or both may be configurable, for example by some sort of initialization process, such as a system BIOS. Either or both may be provided as a parameter to the nested wrap-around access operation as immediate data (for example in an extra byte preceding the address bytes of the command sequence) in the wrap-around read command, or in a separate set-up command, such as a register write command directed to the parameter store, preceding the nested wrap-around access operation.

A more detailed example will be given illustrating how the nested wrap-around access operation of the technology described herein can be implemented. It will be understood that other implementations are possible.

Figure 4:
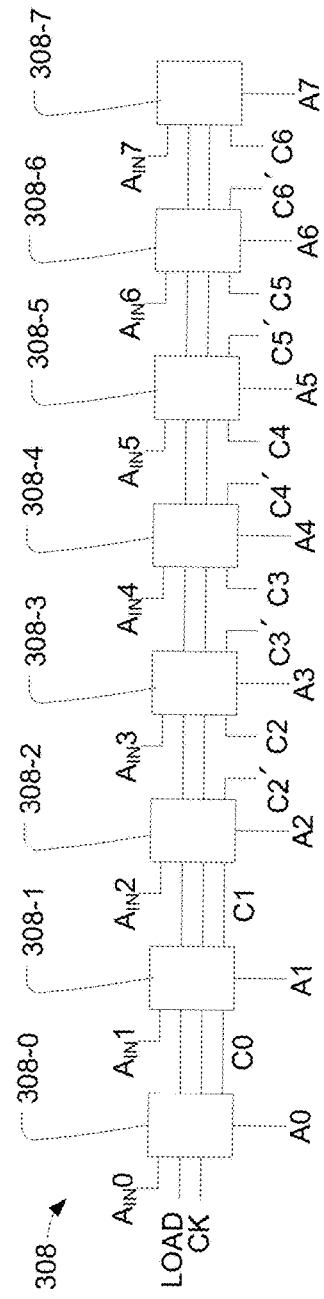
FIG. 4 shows an address counter having controllable carry bits that may generate address sequences for a nested wrap-around access operation.
Figure 5:
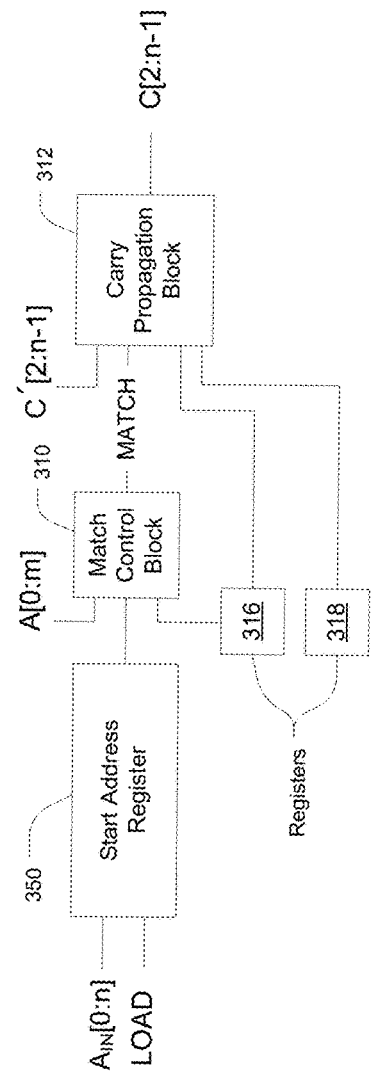
FIG. 5 shows a match block and carry propagation block as described herein.

Address generator 306, as illustrated in FIG. 3, includes address counter 308, start address register 350, match control block 310, and carry propagation block 312. FIGS. 4 and 5 show these elements in more detail. Address counter 308 generates address bits A[0:n]. In FIG. 4, for simplicity, n=7, but of course can be greater than 7. Address bit A0 is the least significant bit of the address. CX' and CX are carry-outs and carry-ins, respectively, from the less-significant bit; i.e. C3' is the carry-out from A3, while C3 is the carry-in to A4. The carry-out bits CX' are supplied to multiplexers in a carry propagation block 312 shown in FIG. 5, the outputs of which are connected to the corresponding carry in's CX. The outputs A0 to A7 can be supplied to an address buffer, or to decoder circuitry, on clock transitions.

FIG. 4 is a diagram of an address counter 308 including a sequence of counter stages 308-0 to 308-7. Each stage has inputs to receive an address bit $A_{IN}X$, a LOAD signal, a clock CK and a carry-in signal C(X−1) (the first stage may not have a carry-in signal input). Each stage has outputs to provide a carry-out signal CX to the next stage, via switches in some or all of the stages as mentioned above. Each stage has outputs to provide an output address AX in each cycle of the clock to produce an address sequence. To support wrap-around operations, the connection of the carry-out signals to the corresponding carry-in inputs is managed by logic such as that shown in FIG. 5. By controlling the connection of the carry-out signals to the corresponding carry-in inputs, an address sequence for a nested wrap-around operation can be generated.

FIG. 5 shows logic for managing the connection of the carry-out signals to the corresponding carry-in inputs. The circuitry of FIG. 5 includes a register 350 holding the starting address for a wrap-around access. The circuitry of FIG. 5 includes match control logic 310 for determining when the address output by address counter 308 matches a wrap-around section start address as specified by the wrap-around section length parameter in parameter store, and for producing a MATCH signal. The input A[0:m] is address output bits from address counter 308 of FIG. 4. The index "m" can be set using the wrap-around section size parameter, or be set by default to be large enough to accommodate the maximum wrap-around section size to be allowed in the device. The circuitry of FIG. 5 includes carry propagation logic 312 which selectively connects the carry-out signals (designated by the C'[2:n−1] in this example) to corresponding carry-in inputs (designated C[2:n−1] in this example), in response to the MATCH signal and to the wrap-around count parameter in parameter store.

For a wrap-around read operation, by way of input lines $A_{IN}[0:7]$, the supplied start address is loaded into address counter 308 and, in FIG. 5, into start address register 350. The start address register 350 holds at least the bits defining the starting address offset from the wrap-around section lower boundary. Internal control signals such as LOAD and CK may be generated by mode logic 320 or state machine 322 and may control loading of address counter 308. In the present example (as in the earlier example of FIG. 2b) the start address is 202, wrap-around section length=8 and wrap-around count=4. The length of the wrap-around block, then, is 8×4=32 bytes.

The wrap-around section length defines the address bits to use for wrap-around. In this example, wrap-around section length is 8. Three bits are necessary to express eight states, so wrapping within the wrap-around section occurs within the three least significant bits, A[0:2]. In this case, the address offset used in the nested wrap around is the three least significant bits of the supplied starting address.

Address counter 308, in coordination with carry propagation logic 312 of FIG. 5, is used to generate a sequence of addresses to access the array 328, one address for each cycle of the address sequence in this example. In each address cycle, address counter 308 is incremented by 1 while a carry-in input determined by match control block 310 (carry-in C2 in this example) is held to 0. Holding carry-in C2 to 0 guarantees that the address will not advance beyond the upper boundary of an 8-byte wrap-around section. For example, for a start address of 202 (as in FIG. 2b), holding carry-in C2 to 0 guarantees that the address will not advance beyond 207 (binary 1100 1111), but will instead wrap from upper boundary 207 to lower boundary 200 (binary 1100 1000).

Referring to FIGS. 4 and 5, register 316 holds wrap-around section length and register 318 holds wrap-around count. Each time address counter 308 is incremented, bits A[0:2] in this example are compared to the least significant three bits of the start address in start address register 350, which define the address offset from a section boundary of the starting address. The register 316 contains the wrap-around section length and thus defines the number of bits to compare, so register 316 is input to match control block 310, which makes the comparison. The value of MATCH, the output of match control block 310, is set based on the comparison. So long as A[0:2] and the least significant three bits of start address register 350 are not the same, MATCH=0.

After generating eight addresses (202, 203, 204, 205, 206, 207, 200, and 201, in this example), the address in address counter 308 is, as usual, incremented by one. When the least significant three bits of the incremented address, A[0:2], are compared to the least significant three bits of start address register 350 by match control block 310, it will be found that they match, and MATCH=1.

If MATCH=1, then a carry-in input is selected based on the wrap-around count and wrap-around section length. In the case of a wrap-around count of 4 and a wrap-around section length of 8 bytes, carry-in C2 is set to 1, carry-in C3 is set to carry-out C3', and carry-in C4 is set to 0. By forcing carry-in C2 to 1, A3 is forced to increment. A4 is allowed to increment normally, and A5 is not allowed to increment. This arrangement of carry-in bits is chosen to accommodate a wrap-around count of 4. Wrap-around count is held in register 318, so register 318 is input to carry propagation block 312. The wrap-around count parameter and the wrap-around section length parameter are used to determine the state of switches used to provide carry-in signals to the address counter stages necessary for accommodating the wrap-around count options available on the device. The switches are configurable to set the carry-in inputs to a selected one of a carry-out from a previous stage, a logic 0 and a logic 1. Referring to FIG. 2b, forcing A3 to increment adds 8 to the address, resulting in the jump from address 201 to address 210 (from binary 1100 1001 to binary 1101 0010.)

Referring to FIGS. 2b, 4 and 5, eight addresses are generated as before in a wrap-around manner from 210 to 215 to 208 and 209, again holding carry-in C2=0. When the wrap starting address offset is reached, then, again, MATCH=1. As before, carry-in C2=1, carry-in C3=carry-out C3', and carry-in C4=0, this time resulting in the jump from 209 to 218 (from binary 1101 0001 to binary 1101 1010.)

After reading eight addresses with carry-in C2=0 and incrementing address counter 308, the next address is the wrap starting address, 218, and MATCH=1. Again, C2=1, C3=C3', and C4=0. Because C4 is held to 0, A5 will never increment, resulting in a jump from 217 to 194 (from binary 1101 1001 to binary 1100 0010.)

After reading eight addresses with carry-in C2 held to 0, and incrementing address counter 308, the next address is the wrap starting address 194, and MATCH=1. With carry-in C2=1, C3=C3', and C4=0, wrap starting address jumps from 193 to 202 (binary 1100 0001 to 1100 1010), which was the supplied start address. This completes one wrap through all of the wrap-around sections in the wrap-around block. The access operation continues until a termination event. The termination event, like the toggling of a chip enable control signal, can cause the clock signal CK to be turned off, for example.

In the embodiment shown in FIG. 4, the smallest wrap-around section length allowed is 8, so there is no need to control carry bits C0 and C1; i.e. carry-out is always the same as the carry-in. In a different embodiment, for example, if a wrap-around section length of 4 addressable units were permitted, then it would have to be possible for C1 to be different from C1'. Alternatively, if the smallest wrap-around section length allowed were 16, then there would be no need to control carry-in C2.

Note that registers 316 and 318, which hold values for wrap-around section length and wrap count, are shown in FIG. 5 for convenience. As shown in FIG. 3 and described earlier, these parameters may not be stored in address generator 306; they may be stored in data register 314 or elsewhere. These parameters may be held in any volatile or non-volatile memory. Either or both may be copied from one location to another when a nested wrap-around read operation is to be performed.

To summarize, the contents of an address is read, then the address is incremented. When the next address does not match the start address, carry-in C2=0. When the next address does match the start address (when a wrap of the wrap-around section length is finished), carry-in C2=1, incrementing A3 and forcing a jump of the wrap-around section length. C3 is not controlled, so A4 increments normally. By holding carry-in C4 to 0, A5 never increments, so reading cannot advance beyond the end of the wrap-around block. It will be recalled that the wrap-around block begins at the address equal or less than the starting address which is evenly divisible by the wrap-around block. In the example just given, the wrap-around block was 32 and the start address was 194, so the wrap-around block extended from a lower wrap-around boundary of 192 to an upper wrap-around boundary of 233. The lower and upper wrap-around boundaries would be the same for any starting value between 192 and 233.

In one embodiment, wrap-around section length can be 8, 16, 32, or 64. In the example just provided, wrap-around section length was 8, and match control block 310 compared address bits A[0:2] with the three least significant bits of start address register 350. If wrap-around section length were 16, match control block 310 would compare address bits A[0:3] with the four least significant bits of start address register 350; if wrap-around section length were 32, match control block 310 would compare address bits A[0:4] with the five least significant bits of start address register 350; and so on.

As shown in FIG. 5, carry propagation block 312 sets carry-in bits C[2:n−1] based on wrap-around section length (stored in register 316), wrap-around count (stored in register 318), the value of carry-out bits C[2:n−1], and the value of MATCH.

If wrap-around count is 1, only one carry-in bit is controlled. The carry-in from the most significant bit corresponding to the wrap-around section length is held at 0 while MATCH=0. When MATCH=1, the carry-in from the most significant bit corresponding to the wrap-around section length is forced to 1. Thus the controlled carry-in bit is C2 when wrap-around section length=8, C3 when wrap-around section length=16, C4 when wrap-around section length=32, C5 when wrap-around section length=64, etc.

If wrap-around count is 2 (as in FIG. 2a), two consecutive carry-in bits are controlled. The carry-in from the most significant bit corresponding to the wrap-around section length is held at 0 until MATCH=1, then forced to 1. The next highest carry-in bit is held to 0. The controlled carry-in bits are C2 and C3 when wrap-around section length=8, C3 and C4 when wrap-around section length=16, C4 and C5 when wrap-around section length=32, and C5 and C6 when wrap-around section length=64.

If wrap-around count is 4, two non-consecutive carry-in bits are controlled, with a carry-in bit between them allowed to advance normally. The carry-in from the most significant bit corresponding to the wrap-around section length is held at 0 when MATCH=0, then, when MATCH=1, is forced to 1. The next higher carry-in bit is allowed to advance normally. The next higher carry-in bit is held to 0. When wrap-around section length=8, then, the controlled carry-in bits are C2 and C4, with C3=C3'. When wrap-around section length=16, the controlled carry-in bits are C3 and C5, and C4=C4'. When wrap-around section length=32, the controlled carry-in bits are C4 and C6, and C5=C5'. When wrap-around section length=64, the controlled carry-in bits are C5 and C7, and C6=C6'.

For a wrap-around count of a higher power of two, such as 8, 16, 32, etc., two non-consecutive carry-in bits are controlled, with carry-in bits between them allowed to advance normally. For example, for a wrap-around section length of 8 and a wrap-around count of 16, the controlled carry-in bits are C2 and C5, while C3=C3' and C4=C4'.

More generally, when wrap-around section length L is a power of two, and the number of bits required to express L states is B (for L=8, B=3; for L=16, B=4; for L=32, B=5, etc.) then the lower carry-in bit to be controlled is B−1 (C2 for L=8, C3 for L=16, C4 for L=32, etc.) When wrap-around count is a finite number and wrap-around block length WL is a power of two, and the number of bits required to express WL states is B, the upper carry-in bit to be controlled is B−1 (C3 for WL=16, C4 for WL=32, C5 for WL=64, etc.) Any bits between the lower controlled carry-in bit and the upper controlled carry-in bit are allowed to advance normally.

If wrap-around count is unlimited, then the carry-in bit from the most significant bit corresponding to the wrap-around section length (C2 if wrap-around section length=8, C3 if wrap-around section length=16, C4 if wrap-around section length=32, C5 if wrap-around section length=64) is held to 0 until MATCH=1, then forced to 1. All higher order carry bits are uncontrolled, and the addresses advance normally to the end of the address space. At the end of the address space, when MATCH=1, bits A[0:m] defining the wrap-around section length (m=2, 3, 4, or 5 for wrap-around section length 8, 16, 32, or 64) remain at the start address, while all higher bits, A[m+1:N], are set to zero, to begin again.

Figure 6:
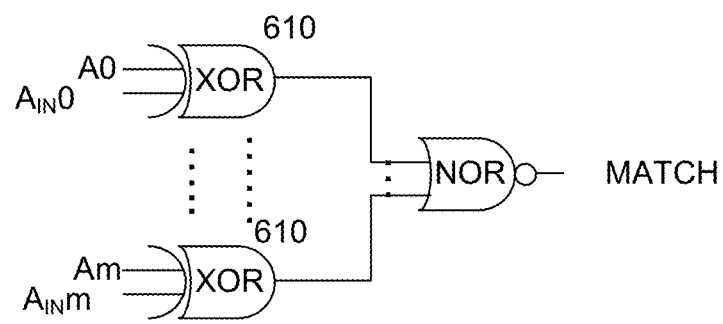
FIG. 6 provides detail regarding the match block of FIGS. 4 and 5 as described herein.

FIG. 6 illustrates a possible implementation of the match logic, corresponding to match control block 310 of FIGS. 3 and 5. A set of parallel XOR gates 610 each takes as input one bit of A[0:m] and the corresponding bit of $A_{IN}$[0:m]. The number of address bits to be compared (the number of XOR gates used) is the number of bits necessary to express wrap-around section length states. For example, when wrap-around section length is 8, the starting address offset includes three bits and three bits are compared (bits A[0:2] are compared to bits $A_{IN}$[0:2]) and three parallel XOR gates are used. When wrap-around section length is 16, the starting address offset includes four bits and four bits are compared (bits A[0:3] are compared to bits $A_{IN}$[0:3]), and four parallel XOR gates are used, and so on. The logic to select the number of XOR gates can include switches controlled in response to the wrap-around section length parameter, by which the outputs of the XOR gates are provided or not to the NOR gate, or other logic circuits can be used as well understood by those skilled in the art. The output of each XOR function is 0 if the A and $A_{IN}$ bits are the same. The outputs of the XOR gates all feed into a NOR gate, which is 1 only if all inputs are zero. Thus MATCH=1 only when all m+1 bits of $A_{IN}$[0:m] (the start address) and A[0:m] (the next address to be accessed) are the same.

Figure 7:
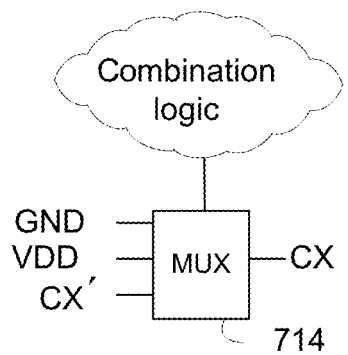
FIG. 7 provides detail regarding the carry propagation block of FIGS. 4 and 5 as described herein.

FIG. 7 shows a possible implementation of the carry propagation logic for one address stage, corresponding to carry propagation block 312 of FIGS. 3 and 5. It will be recalled that for each carry-out/carry-in pair that may be controlled, the carry-in CX will either be forced to 0, forced to 1, or set to the carry-out CX'. A multiplexor 714 (or switch) selects between GND (a value of 0), VDD (a value of 1) or the value of the carry-out bit CX'. The carry-in bit CX is set to the result. So, for example, if wrap-around section length=8 and wrap-around count=4, the carry propagation multiplexor 714 for C2 will select GND if MATCH=0 and VDD if MATCH=1. The next carry bit, C3, is allowed to advance normally, so for C3 it will select C3'. The next carry bit, C4, is forced to zero, so for C4 it will select GND. For C5 through Cn, it will select C5' through Cn'. There will be a multiplexor 714 for each carry-in bit that may need to be controlled. As described earlier, wrap-around section length and wrap-around count together determine whether one or two carry-in bits are controlled, which bits, and whether the controlled carry-in bits are consecutive. The combination logic decodes the wrap-around section length and wrap-around count parameters as described above to control the multiplexer 714 in each address counter stage.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device configured to execute an access operation, comprising:
   an addressable memory;
   logic responsive to a command specifying a supplied starting address, identifying a starting section of a block and an address offset, to generate an address sequence for the block of the addressable memory, the block including a number N of sections having a number of M addressable units, the numbers N and M being integers greater than one;
   the address sequence including a series of address sub-sequences each address sub-sequence in the series of address sub-sequences corresponding to a corresponding section in the number N of sections, the series of address sub-sequences including a starting sub-sequence for the starting section, wherein the starting section is offset from a boundary of the block by one or more sections, the series of sub-sequences incrementing by section to an upper boundary of the block, and wrapping around to a lower boundary of the block; and each of the address sub-sequence in the series of address sub-sequences for each section of the number N of sections respectively having respective section boundaries and starting address offset from the respective section boundaries by the address offset, and each of the address sub-sequence for each section of the number N of sections respectively incrementing by an addressable unit until an upper section boundary of the respective section boundaries and wrapping around to a lower section boundary of the respective section boundaries;

the address offset, in each section of the number N of sections, is same for each section of the number N of sections and the address offset, in each section of the number N of sections, is non-zero;

the addressable memory is read or written at the generated address sequence, until a termination event; and the termination event is a control signal generated when the access operation has completed a specified number of wraps around the block, using a counter and a comparator.

2. The device of claim 1, including a parameter store holding:
   a first parameter specifying a section length equal to the number M of addressable units; and
   a second parameter specifying a wrap-around count equal to the number N of sub-sequences.

3. The device of claim 2 wherein the parameter store is non-volatile memory.

4. The device of claim 2 wherein the parameter store is write-once memory.

5. The device of claim 1 wherein one or both of the numbers N and M comprise a command parameter.

6. The device of claim 1, wherein the logic includes an address sequencer to generate the address sequence by setting a wrap starting address to the supplied starting address, and
   a) for a sub-sequence in the series of address sub-sequences of a given section of the number N of sections, beginning with the wrap starting address, incrementing by the addressable unit until an upper boundary of the given section, wrapping around to a lower boundary of the given section, and incrementing to an address preceding the wrap starting address,
   b) if the wrap starting address plus the number M is less than the upper boundary of the block, then incrementing the wrap starting address by the number M, else setting the wrap starting address to the lower boundary of the block plus the address offset identified by the supplied starting address, and
   c) repeating steps a) and b) until the termination event.

7. The device of claim 6 wherein both the upper boundary of the respective section boundaries and the lower boundary of the respective section boundaries, in each of the section of the number N of sections, have addresses in which members of a first set of least significant bits are all zero or are all one, respectively.

8. An access operation configured to be executed by a device including an addressable memory, the access operation comprising:
   receiving a command specifying a supplied starting address, where the supplied starting address identifies a starting section of block in the addressable memory, and an address offset; and
   generating an address sequence for the block of the addressable memory, the address sequence including a series of address sub-sequences for a number N of sections of the block, including a starting sub-sequence for the starting section, wherein the starting section is offset from a boundary of the block by one or more sections, and arranged in a series of sub-sequences incrementing by section to an upper boundary of the block, wrapping around to a lower boundary of the block;

each section of the number N of sections respectively having M addresses;

each address sub-sequence in the series of address sub-sequences for each section of the number N of sections respectively having respective section boundaries and starting address offset from the respective section boundaries by the address offset, and each of the address sub-sequence for each section of the number N of sections respectively incrementing by an addressable unit until an upper boundary of the respective section boundaries and wrapping around to a lower boundary of the the respective section boundaries;

the address offset, in each section of the number N of sections, is same for each section of the number N of sections and the address offset, in each section of the number N of sections, is non-zero;

the addressable memory is read or written at the generated address sequence, until a termination event; and the termination event is a control signal generated when the access operation has completed a specified number of wraps around the block, using a counter and a comparator.

9. The operation of claim 8, wherein said generating includes, executing a process using a first parameter specifying a section length equal to the number M, and a second parameter specifying a wrap-around count equal to the number N, the first parameter and the second parameter held in a parameter store, and including, after setting a starting address to the supplied starting address:
   a) generating an address sub-sequence of the series of address sub-sequences beginning with the starting address, incrementing by an addressable unit until an upper boundary of a current section of the number N of sections, wrapping around to a lower boundary of the current section of the number N of sections, and incrementing until an address of an addressable unit immediately precedes the starting address,
   b) if the starting address plus the section length is less than the upper boundary of the block, then incrementing the starting address by the section length, else setting the starting address to the lower boundary of the block plus the address offset identified by the supplied starting address, and
   c) repeating steps a) and b) until the termination event.

10. The operation of claim 9 wherein the termination event is receipt of a control signal.

11. The operation of claim 9 wherein both the upper boundary of the respective section boundaries and the lower boundary of the respective section boundaries, in each of the section of the number N of sections, have addresses in which members of a first set of least significant bits are all zero or are all one.

12. The operation of claim 8 wherein the block is an entire addressable space of a memory on the device.

13. The operation of claim 9 wherein at least one of the section length and wrap-around count is stored in non-volatile memory.

14. The operation of claim 8 wherein the access operation is a read operation.

15. The operation of claim 8 wherein the access operation is a write operation.

16. The operation of claim 8 storing parameters specifying the numbers M and N in a write-once memory.

17. A method for wrap-around addressing of an addressable memory, comprising:

using a starting address, a wrap-around section length and a wrap-around block length, generating an address sequence for the addressable memory; including a) in a current wrap-around section identified by the starting address, the current wrap-around section being in a wrap-around block having the wrap-around block length, generating a set of addresses addressing the current wrap-around section in a wrap-around manner, the set of addresses starting with an address offset from a boundary of the current wrap-around section by an amount indicated by the starting address;

b) proceeding in a wrap-around manner to a next section within said wrap-around block, and c) repeating steps a) and b), until a termination event;

the address offset is same for each section within said wrap-around block and the address offset is non-zero;

the addressable memory is read or written at the generated address sequence, until the termination event; and the termination event is a control signal generated when the access operation has completed a specified number of wraps around the block, using a counter and a comparator.

18. The method of claim 17, including storing a wrap-around section length parameter and a wrap-around count parameter, wherein the wrap-around section length is determined using the wrap-around section length parameter and the wrap-around block length is determined using the wrap-around section length parameter and the wrap-around count parameter.

* * * * *